US012598825B2

(12) United States Patent
Yang et al.

(10) Patent No.: US 12,598,825 B2
(45) Date of Patent: Apr. 7, 2026

(54) SUBSTRATE CONTACT IN WAFER BACKSIDE

(71) Applicant: Taiwan Semiconductor Manufacturing Company, Ltd., Hsinchu (TW)

(72) Inventors: Hao-Lin Yang, Kaohsiung (TW); Fu-Sheng Kuo, Tainan (TW); Ching-Chun Wang, Tainan (TW); Hsiao-Hui Tseng, Tainan (TW); Tzu-Jui Wang, Fengshan (TW); Chen-Jong Wang, Hsin-Chu (TW); Dun-Nian Yaung, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 550 days.

(21) Appl. No.: 18/149,760

(22) Filed: Jan. 4, 2023

(65) Prior Publication Data

US 2024/0145498 A1    May 2, 2024

Related U.S. Application Data

(60) Provisional application No. 63/419,440, filed on Oct. 26, 2022.

(51) Int. Cl.
H10F 39/00 (2025.01)
H10F 39/18 (2025.01)

(52) U.S. Cl.
CPC ....... H10F 39/8033 (2025.01); H10F 39/014 (2025.01); H10F 39/18 (2025.01); H10F 39/807 (2025.01); H10F 39/811 (2025.01)

(58) Field of Classification Search
None
See application file for complete search history.

(56) References Cited

U.S. PATENT DOCUMENTS

| | | | |
|---|---|---|---|
| 9,978,805 B2 | 5/2018 | Wang et al. | |
| 2006/0043438 A1 | 3/2006 | Holm et al. | |
| 2014/0167200 A1* | 6/2014 | Sun | H10F 39/807 257/443 |
| 2014/0291793 A1* | 10/2014 | Tanaka | H10F 39/024 257/435 |
| 2017/0170229 A1 | 6/2017 | Oh et al. | |
| 2017/0263657 A1 | 9/2017 | Chu et al. | |
| 2019/0172868 A1 | 6/2019 | Chen et al. | |
| 2020/0227582 A1* | 7/2020 | Yamashita | H10F 39/809 |
| 2021/0111202 A1 | 4/2021 | Ha et al. | |
| 2021/0313477 A1* | 10/2021 | Kusukawa | H10F 39/807 |
| 2022/0406825 A1* | 12/2022 | Jin | H10F 39/8037 |

* cited by examiner

*Primary Examiner* — Nilufa Rahim
(74) *Attorney, Agent, or Firm* — Eschweiler & Potashnik, LLC

(57) ABSTRACT

An integrated chip including includes a substrate having a first side and a second side opposite the first side. The integrated chip further includes a first photodetector positioned in a first pixel region within the substrate. A floating diffusion region with a first doping concentration of a first polarity is positioned on the first side of the substrate in the first pixel region. A first body contact region with a second doping concentration of a second polarity different from the first polarity is positioned on the second side of the substrate in the first pixel region.

20 Claims, 20 Drawing Sheets

200a

200b

300a

300b

500a

500b

600a 602a        602b        602c

600b 602a        602b        602c

700

1000

1400 ⬋

2000

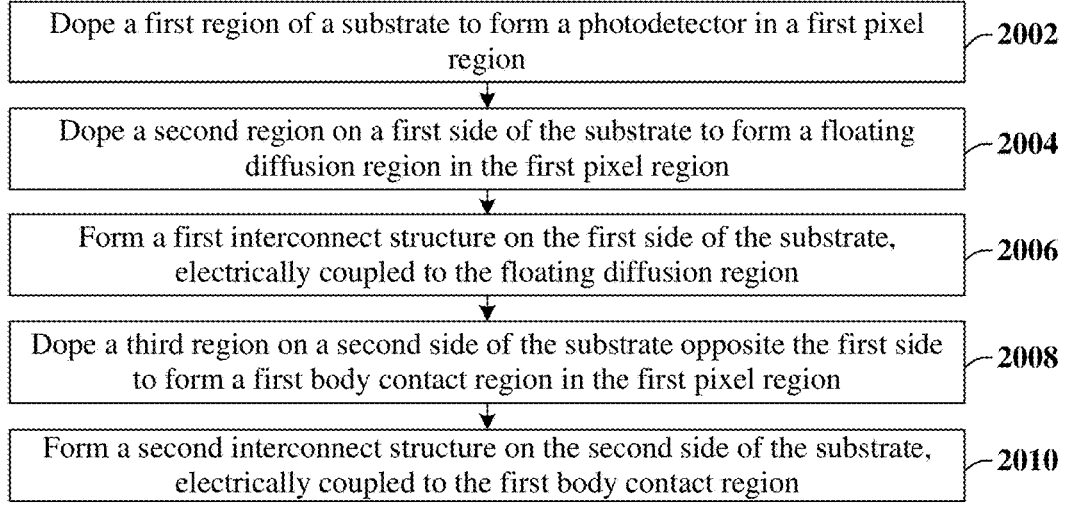

Dope a first region of a substrate to form a photodetector in a first pixel region ⸺2002

Dope a second region on a first side of the substrate to form a floating diffusion region in the first pixel region ⸺2004

Form a first interconnect structure on the first side of the substrate, electrically coupled to the floating diffusion region ⸺2006

Dope a third region on a second side of the substrate opposite the first side to form a first body contact region in the first pixel region ⸺2008

Form a second interconnect structure on the second side of the substrate, electrically coupled to the first body contact region ⸺2010

Fig. 20

SUBSTRATE CONTACT IN WAFER BACKSIDE

REFERENCE TO RELATED APPLICATION

This application claims the benefit of U.S. Provisional Application No. 63/419,440, filed on Oct. 26, 2022, the contents of which are hereby incorporated by reference in their entirety.

BACKGROUND

Many modern day electronic devices contain digital image sensors. Digital image sensors may be backside illumination sensors or frontside illumination sensors. Backside illumination sensors can increase the amount of light captured by the sensor while frontside illumination sensors have a greater response uniformity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 20 illustrates a flow diagram of some embodiments of a method of forming a pixel array including a substrate contact on the backside of the wafer.

DETAILED DESCRIPTION

Figures 1A, 1B:
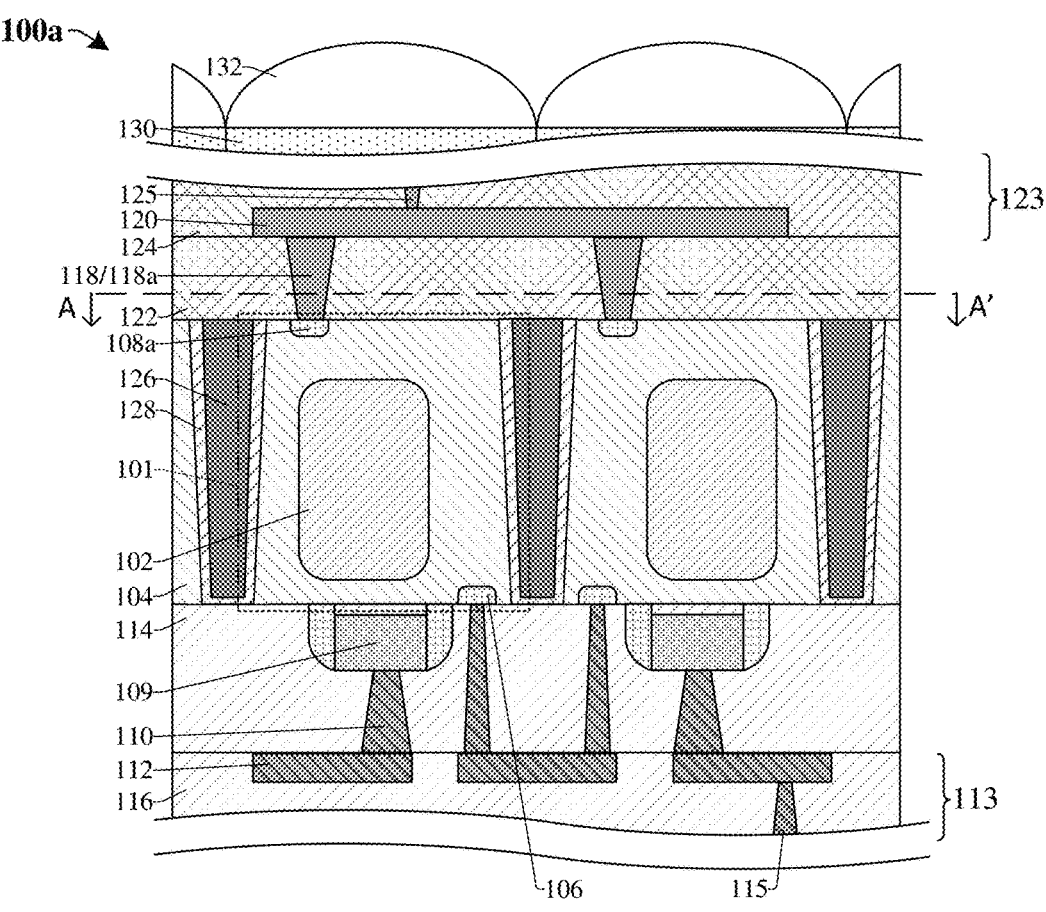
FIGS. 1A and 1B illustrate a cross-sectional view and a top view of some embodiments of a pixel array including a substrate contact on the backside of the wafer according to the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A pixel region of a digital image sensor contains a floating diffusion region, a photodetector and a body contact region. An interconnect structure is electrically coupled to the floating diffusion region and the body contact region, providing a bias voltage for the body contact region and pixel circuitry for delivering the reading of the photodetector through the floating diffusion region. A transfer transistor is on one side of the pixel region between the floating diffusion region and the photodetector. The transfer transistor induces a channel between the photodetector and the floating diffusion region when a voltage over a threshold voltage is applied to its gate, so that a charge from the photodetector can travel through the floating diffusion region to the pixel circuitry.

When the floating diffusion region is close to the body contact region, leakage may occur. The leakage may cause a dark current of the pixel region, thereby lowering the dynamic range of the pixel and introducing noise in to the resulting image. The amount of leakage present depends on the proximity of the floating diffusion region to the body contact region. To avoid having a large leakage current, the floating diffusion region and the body contact region have a minimum lateral distance between them. This limits the scalability and supported resolutions of the image sensor.

The present disclosure provides for techniques to embed the body contact region in a backside of the pixel region, vertically separating the floating diffusion region from the body contact region. The body contact region on the backside of the pixel region increases the distance between the body contact region and the floating diffusion region in a vertical direction, thereby lowering the leakage current and effectively removing the minimum distance from consideration in the horizontal direction. This results in improved performance and increased scalability for the digital image sensor.

FIGS. 1A and 1B illustrate a cross-sectional view 100a and a top view 100b of some embodiments of a pixel array including a substrate contact on the backside of the wafer according to the present disclosure.

As shown in the cross-sectional view 100a of FIG. 1A, a photodetector 102 is within a first pixel region 101 of a substrate 104. A floating diffusion region 106 is on a first side 104f of the substrate 104 in the first pixel region 101, and is embedded within the substrate 104. A first body contact region 108a is on a second side 104s of the substrate 104 in the first pixel region 101, and is embedded within the substrate 104. The second side 104s is opposite the first side 104f of the substrate 104. A transfer transistor 109 is on the first side 104f of the substrate 104 to one side of the floating diffusion region. The transfer transistor 109 is configured to control the transfer of charge from the photodetector 102 to the floating diffusion region 106.

First contacts 110 are on the first side 104*f* of the substrate 104, and are electrically coupled to the transfer transistor 109 and the floating diffusion region 106. In some embodiments, a silicide (not shown) is between the floating diffusion region 106 and the first contacts 110. In other embodiments, a silicide is not present between the floating diffusion region 106 and the first contacts 110, and the silicide lowers junction leakage within the pixel array. The first contacts 110 and the transfer transistor 109 are surrounded by a first dielectric layer 114. The first contacts 110 are further coupled to a first interconnect structure 113. The first interconnect structure comprises a plurality of wires 112 and a plurality of vias 115. In some embodiments, the plurality of wires 112 are separated into one or more wire levels (not shown). In further embodiments, the one or more wire levels are separated by one or more via levels (not shown). The first interconnect structure 113 is surrounded by a first interconnect dielectric 116. The first interconnect structure may electrically couple the pixel array to additional pixel circuitry, such as an in-pixel circuit or an application-specific integrated circuit (ASIC circuit) as described in relation to FIG. 6.

A conductive structure 118 is on the second side 104*s* of the substrate 104 and is electrically coupled to the first body contact region 108*a*. In some embodiments, the conductive structure 118 extends vertically (as a contact 118*a*) to a plurality of wires 120 within a second interconnect structure 123. The conductive structure 118 is surrounded by a second dielectric layer 122. In some embodiments, the second interconnect structure 123 comprises the plurality of wires 120 and a plurality of vias 125. In some embodiments, the plurality of wires 120 are arranged in one or more wire levels (not shown) and the plurality of vias 125 are arranged in one or more via levels (not shown) spacing the one or more of wire levels. In other embodiments, the second interconnect structure may comprise a plurality of wires 120 coupled to the conductive structure 118 without a plurality of vias 125. In some embodiments, the second interconnect structure is electrically coupled to a ground (not shown). In other embodiments, the second interconnect structure is electrically coupled to a bias voltage source (not shown). By coupling the second interconnect structure to a bias voltage source, a voltage bias of the first body contact region 108*a* and the body of the transfer transistor 109 may be controlled to alter the functionality of the transfer transistor 109.

In some embodiments, the photodetector 102, the floating diffusion region 106, and the first body contact region 108*a* are surrounded by a deep trench isolation (DTI) structure 126. In some embodiments, the DTI structure is surrounded by in insulative layer 128. In some embodiments, a color filter 130 and a microlens 132 are disposed above the photodetector 102. The color filter 130 is configured to control the color of the light that may reach the photodetector. The microlens 132 is configured to direct the light hitting an upper surface of the pixel array towards the photodetector 102.

The first body contact region 108*a* being on the second side 104*s* of the substrate 104 vertically separates the first body contact region 108*a* from the floating diffusion region 106, which mitigates or eliminates the use of the minimum lateral distance between the two features, thereby enhancing the scalability of the pixel array and reducing leakage.

As shown in the top view 100*b* of FIG. 1B, in some embodiments, the DTI structure 126 is composed of a plurality of DTI segments 136 aligned in a grid pattern and dividing the substrate 104 into a plurality of pixels 134. The second dielectric layer 122 shown in FIG. 1A has been omitted for clarity. In some embodiments, a plurality of photodetectors (not shown; see FIG. 7) is positioned within the substrate 104. The plurality of photodetectors are arranged within the plurality of pixels 134, respectively, as viewed from a top view. In some embodiments, a plurality of floating diffusion regions (not shown) is on the first side of the substrate. The plurality of floating diffusion regions are arranged within the plurality of pixels 134, respectively, as viewed in the top view. In some embodiments, a plurality of body contact regions 138 is on the second side of the substrate. The plurality of body contact regions 138 are arranged within the plurality of pixels 134, respectively, as viewed in the top view. In some embodiments, a plurality of contacts 140 is on the second side of the substrate. The plurality of contacts 140 is arranged within the plurality of pixels 134, respectively, as viewed in the top view.

In some embodiments, the plurality of floating diffusion regions have a one to one correspondence with the plurality of body contact regions 138 and the plurality of photodetectors in the pixel array. For example, if there are twenty photodetectors 102 in the pixel array, there are twenty floating diffusion regions 106 in the pixel array. In other embodiments, the plurality of floating diffusion regions have a quantity less than a quantity of the plurality of body contact regions 138 and less than a quantity of the plurality of photodetectors in the pixel array. For example, if there are twenty-four photodetectors 102 in the pixel array, there are six floating diffusion regions 106 in the pixel array.

Figure 2A:
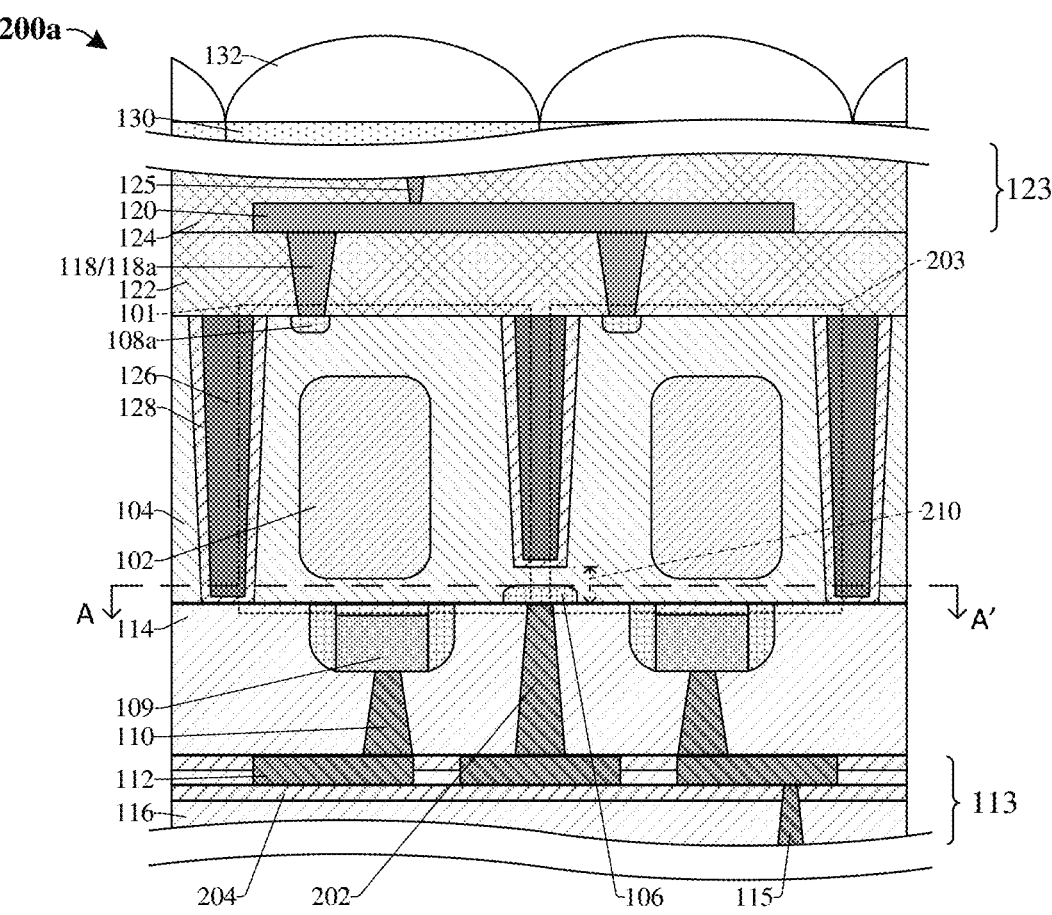
FIGS. 2A and 2B illustrate a cross-sectional view and a top view of some embodiments of a pixel array including a substrate contact on the backside of the wafer.
Figure 2B:
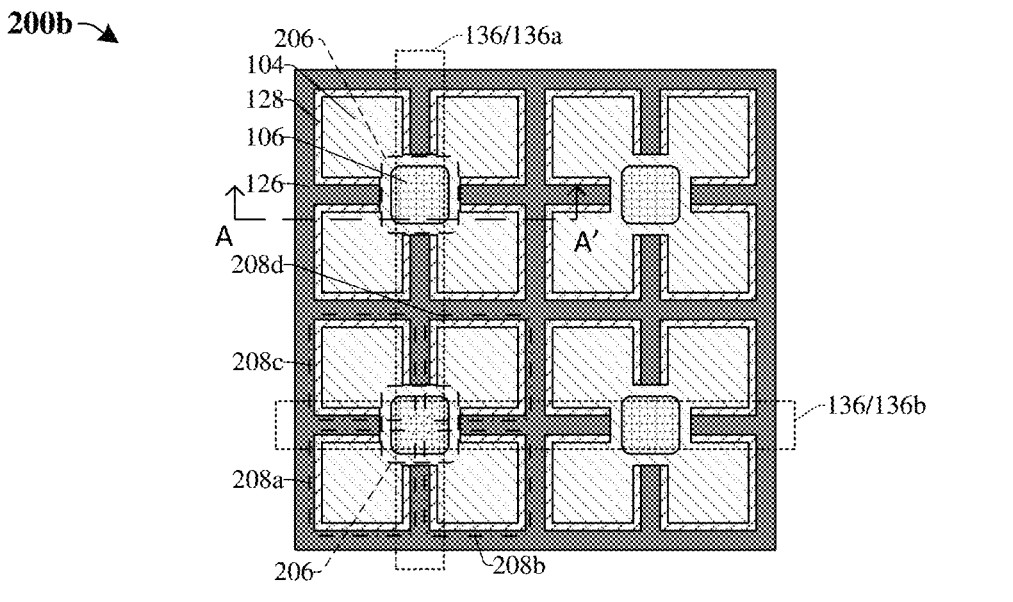

FIGS. 2A and 2B illustrate a cross-sectional view 200*a* and a top view 200*b* of some embodiments of a pixel array including a substrate contact on the backside of the wafer.

As shown in the cross-section view 200*a* of FIG. 2A, in some embodiments, the floating diffusion region 106 may be between a first pixel region 101 and a second pixel region 203. In further embodiments, the floating diffusion region 106 is formed underneath the DTI structure 126. A shared diffusion contact 202 is electrically coupled to the floating diffusion region 106, which is further electrically coupled to the first interconnect structure 113. In some embodiments, the first interconnect structure contains a plurality of etch stop layers 204 between the wire levels and the via levels.

As shown in the top view 200*b* of FIG. 2B, in some embodiments, a first DTI segment 136/136*a* and a second DTI segment 136/136*b* of the DTI structure 126 perpendicularly intersect one another at an intersection 206 to define quadrants 208*a*, 208*b*, 208*c*, 208*d* about the intersection. The second dielectric layer 122 shown in FIG. 2A has been omitted for clarity. In some embodiments, the floating diffusion region 106 is centered on the intersection and extends into the quadrants 208*a*, 208*b*, 208*c*, 208*d*. In some embodiments, the DTI structure 126 extends from a second side 104*s* of the substrate 104 to a first side 104*f* of the substrate 104. In some embodiments, a gap 210 (see FIG. 2A) is left between the first side 104*f* and the DTI structure 126, which houses the floating diffusion region 106. As can be seen in the top view of FIG. 2B, in some embodiments, the floating diffusion region 106 is shared by the quadrants 208*a*, 208*b*, 208*c*, 208*d* surrounding the intersection 206. In some embodiments, a repeating pattern of floating diffusion regions 106 is formed across the pixel array by having a floating diffusion region 106 at alternating intersections of the DTI structure 126 as shown.

Figure 3A:
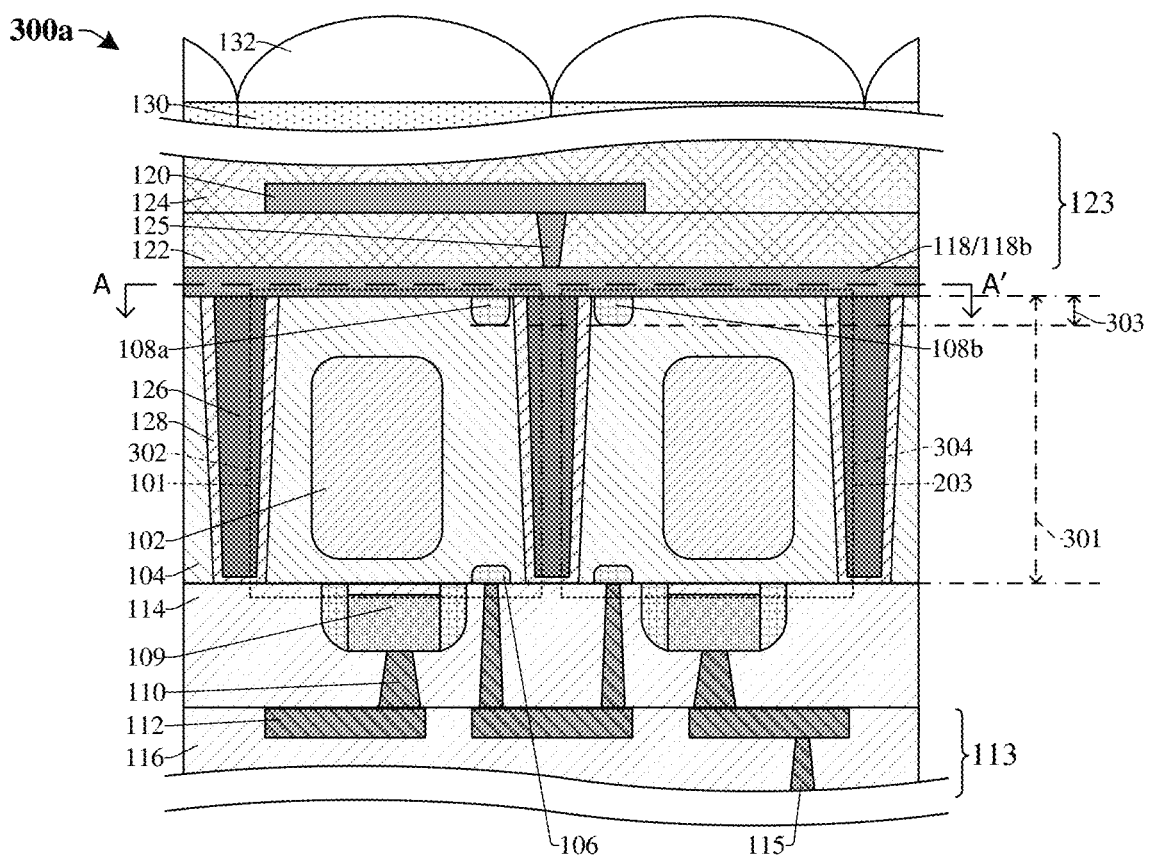
FIGS. 3A and 3B illustrate a cross-sectional view and a top view of some embodiments of a pixel array including a substrate contact on the backside of the wafer.
Figure 3B:
Figure 3B:
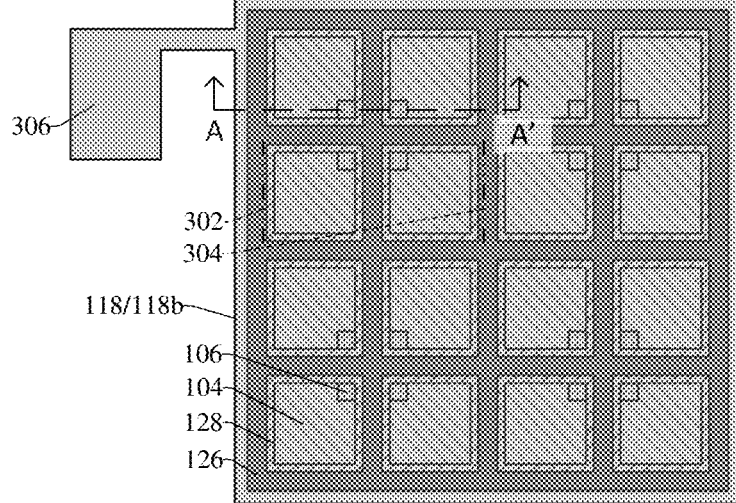

FIGS. 3A and 3B illustrate a cross-sectional view and a top view of some embodiments of a pixel array including a substrate contact on the backside of the wafer.

As shown in the cross-sectional view 300a of FIG. 3A, in some embodiments, the conductive structure 118 is in the shape of a conductive film 118b that extends over the first pixel region 101 and the second pixel region 203. In some embodiments, the conductive film 118b extends over and contacts the first body contact region 108a and a second body contact region 108b in the second pixel region 203. In some embodiments, there is a DTI segment 136 between the first pixel region 101 and the second pixel region 203, and the conductive film 118b extends from a first side 302 of the first pixel region 101 facing away from the DTI segment 136 to a first side 304 of the second pixel region 203 facing away from the DTI segment 136. In further embodiments, the DTI segment 136 is directly between the first side 302 of the first pixel region 101 and the first side 304 of the second pixel region 203.

In some embodiments, the conductive film 118b is directly contacting one or more vias of the plurality of vias 125, which are further electrically coupled to the plurality of wires 120. In some embodiments, there is no second interconnect structure 123, and the conductive film 118b directly couples to the ground or the bias voltage source (not shown).

In some embodiments, the substrate 104 has a first thickness 301 measured from the first side 104f to the second side 104s, and the plurality of body contact regions 138 extend up to a first distance 303 into the substrate 104, wherein the first distance 303 is up to 10% of the first thickness 301 as viewed in a cross-sectional view 300a. In other embodiments, the first distance 303 is up to 5% of the first thickness 301, up to 20% of the first thickness 301, or the like.

In some embodiments, the color filter 130 is contacting the second interconnect structure 123. In other embodiments, the color filter 130 is contacting the conductive film 118b. In some embodiments, the color filter 130 is spaced from the second interconnect structure 123.

As shown in the cross-sectional view 300b of FIG. 3B, in some embodiments the conductive film 118b extends past the first side 302 of the first pixel region 101 and the first side 304 of the second pixel region 203, the conductive film 118b further extending over the pixel array. In some embodiments, a portion 306 of the conductive film 118b extends past the conductive film 118b and is electrically coupled to the ground or the bias voltage source (not shown).

Figure 4A:
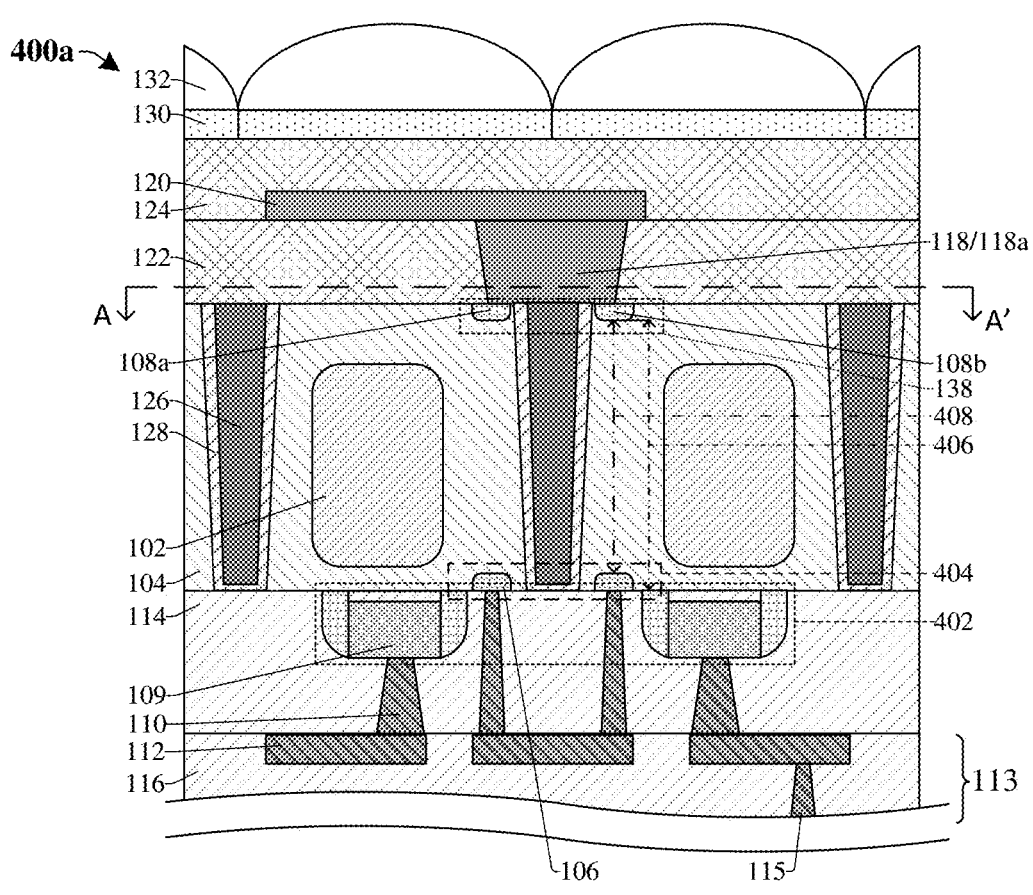
FIGS. 4A and 4B illustrate a cross-sectional view and a top view of some embodiments of a pixel array including a substrate contact on the backside of the wafer.
Figure 4B:
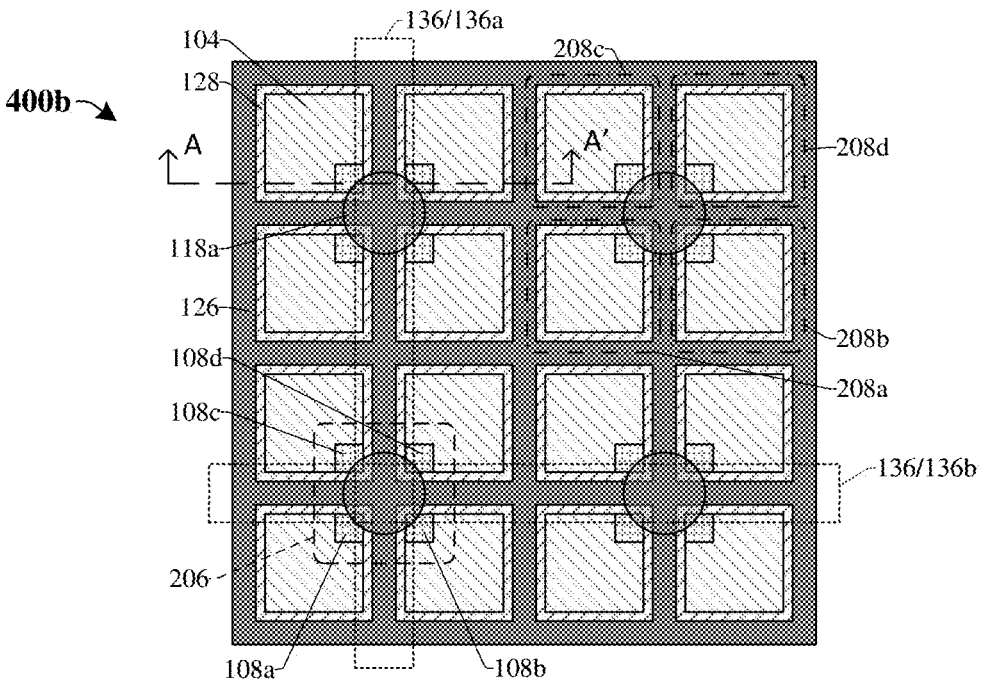

FIGS. 4A and 4B illustrate a cross-sectional view and a top view of some embodiments of a pixel array including a substrate contact on the backside of the wafer.

As shown in the cross-sectional view 400a of FIG. 4A, in some embodiments, the conductive structure 118 is via-shaped and is directly contacting the first body contact region 108a and the second body contact region 108b. In further embodiments, the conductive feature also directly contacts a wire of the plurality of wires 120, which are electrically coupled to the ground or the bias voltage source (not shown).

In some embodiments, a plurality of transfer transistor gate stacks 402 are on the first side 104f of the substrate 104, the plurality of transfer transistor gate stacks 402 being approximately a first distance 406 from the plurality of body contact regions 138 and the plurality of floating diffusion regions 404 being approximately a second distance 408 from the plurality of body contact regions 138, wherein the first distance 406 is greater than the second distance 408.

As shown in the cross-sectional view 400b of FIG. 4B, in some embodiments, a first DTI segment 136/136a and a second DTI segment 136/136b of the DTI structure 126 perpendicularly intersect one another at an intersection 206 to define quadrants 208a, 208b, 208c, 208d about the intersection. The second dielectric layer 122 shown in FIG. 4A has been omitted for clarity. The conductive structure 118 is centered on the intersection and extends over the quadrants 208a, 208b, 208c, 208d. In some embodiments, a first body contact region 108a, a second body contact region 108b, a third body contact region 108c, and a fourth body contact region 108d of the plurality of body contact regions 138 are positioned on the second side 104s of the substrate 104 in the quadrants 208a, 208b, 208c, 208d, respectively. In some embodiments, the conductive structure 118 contacts the first body contact region 108a, the second body contact region 108b, the third body contact region 108c, and the fourth body contact region 108d. In some embodiments, a repeating pattern of conductive structures 118 and the plurality of body contact regions 138 is formed across the pixel array by having a conductive structure 118 at alternating intersections of the DTI structure 126 as shown.

Figure 5A:
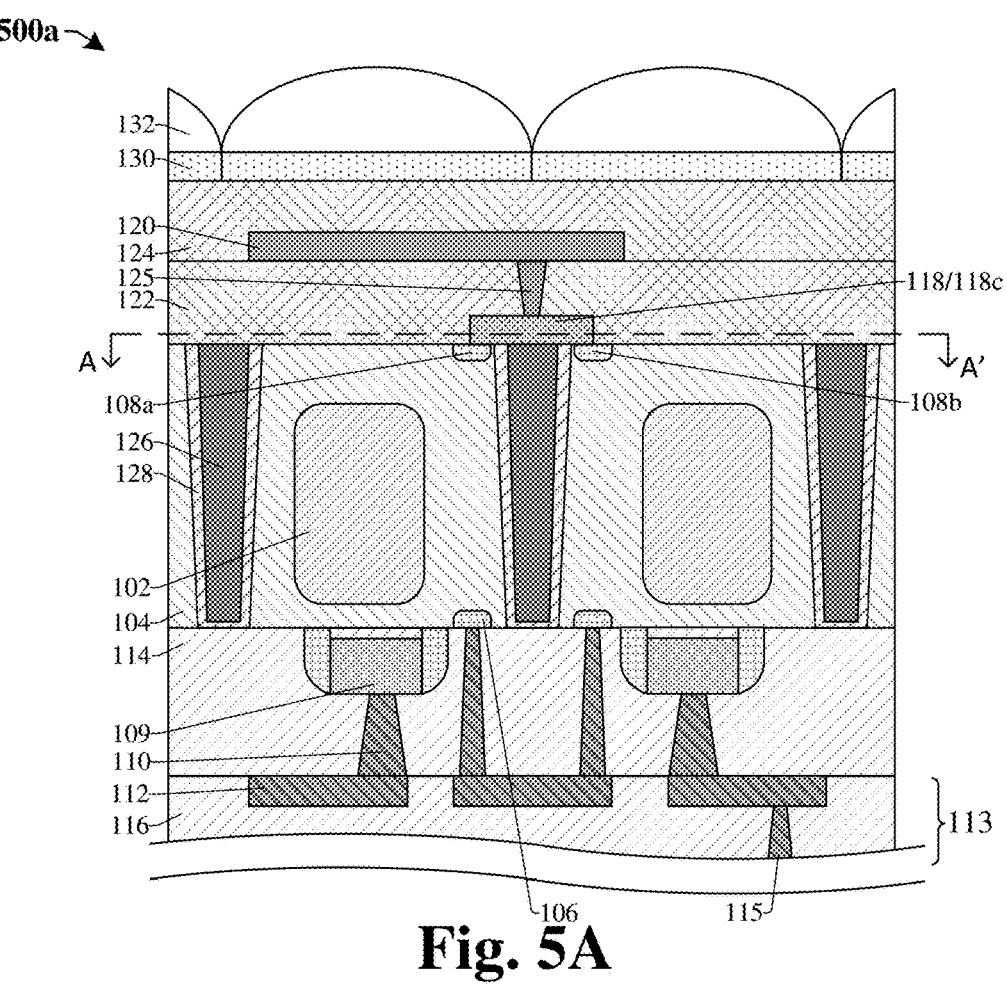
FIGS. 5A and 5B illustrate a cross-sectional view and a top view of some embodiments of a pixel array including a substrate contact on the backside of the wafer.

As shown in the cross-sectional view 500a of FIG. 5A, in some embodiments, the conductive structure 118 is a contact wire 118c contacting the first body contact region 108a. In some embodiments, the contact wire 118c extends over the DTI structure 126 and contacts a second body contact region 108b. In some embodiments, the contact wire 118c does not extend directly over the photodetector 102. In some embodiments, the contact wire 118c does not extend over the entirety of the first and second body contact regions 108a, 108b.

In some embodiments, the contact wire 118c is directly contacting one or more vias of the plurality of vias 125, which further is electrically coupled to the plurality of wires 120.

Figure 5B:
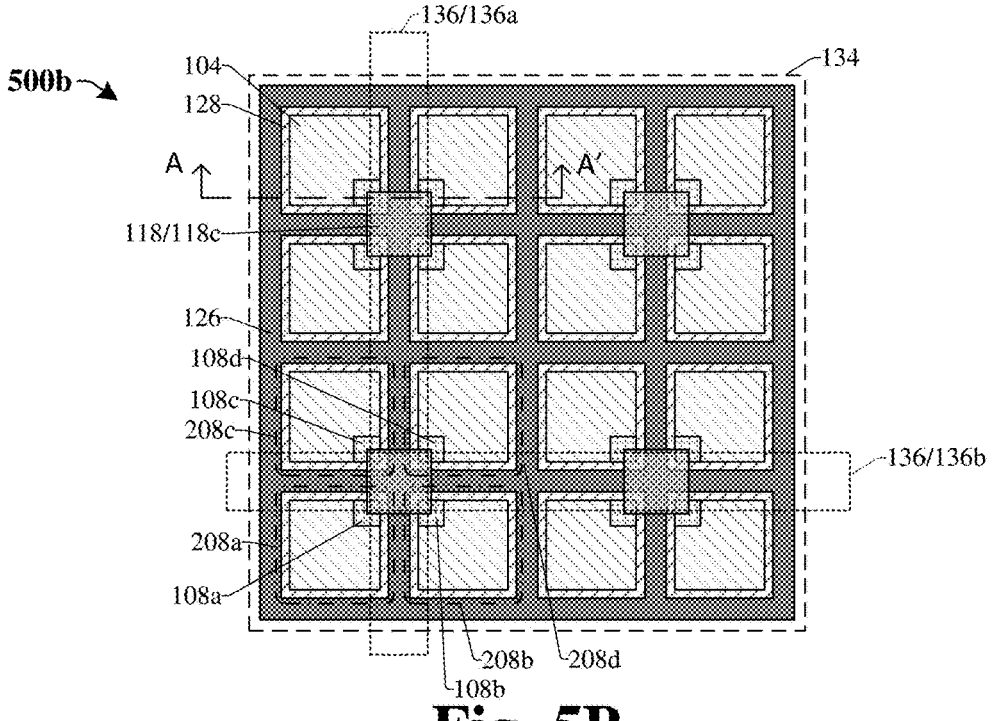

As shown in the top view 500b of FIG. 5B, in some embodiments, the contact wire 118c is shown over a plurality of pixels 134, and is partially covering the first and second body contact regions 108a, 108b as seen from a top view. The second dielectric layer 122 shown in FIG. 5A has been omitted for clarity. In some embodiments, a first DTI segment 136/136a and a second DTI segment 136/136b of the DTI structure 126 perpendicularly intersect one another at an intersection 206 to define the quadrants 208a, 208b, 208c, 208d about the intersection. The contact wire 118c is centered on the intersection and extends over the quadrants 208a, 208b, 208c, 208d. In some embodiments, a first body contact region 108a, a second body contact region 108b, a third body contact region 108c, and a fourth body contact region 108d of the plurality of body contact regions 138 are positioned on the second side 104s of the substrate 104 in the quadrants 208a, 208b, 208c, 208d, respectively. In some embodiments, the contact wire 118c contacts the first body contact region 108a, the second body contact region 108b, the third body contact region 108c, and the fourth body contact region 108d. In some embodiments, a repeating pattern of conductive structures 118 and the plurality of body contact regions 138 is formed across the plurality of pixels 134 by having a conductive structure 118 at alternating intersections of the DTI structure 126 as shown.

Figure 6A:
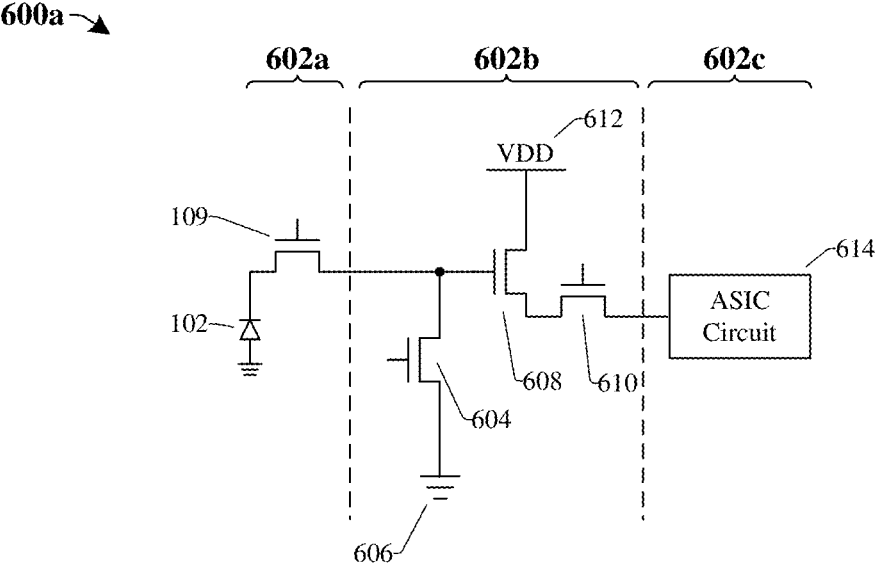
FIGS. 6A and 6B illustrate circuit diagrams of some embodiments of a pixel array including a substrate contact on the backside of the wafer.
Figure 6B:
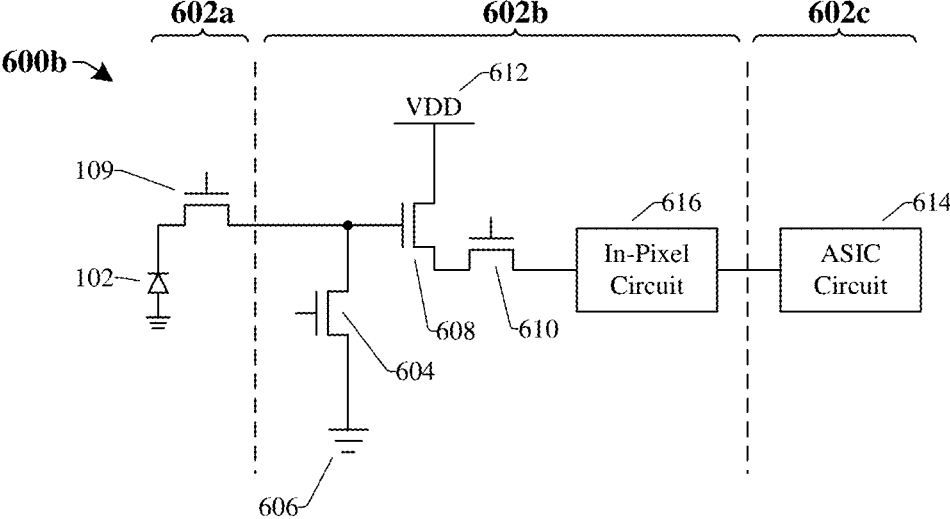

FIGS. 6A and 6B illustrate circuit diagrams of some embodiments of a pixel array including a substrate contact on the backside of the wafer.

As shown in the circuit diagram 600a of FIG. 6A, the circuit diagram 600a is divided into a first chip 602a, a second chip 602b, and a third chip 602c. The first chip 602a comprises the photodetector 102 and the transfer transistor 109. The transfer transistor 109 is electrically coupled through the first interconnect structure 113 (see FIG. 5) to the second chip 602*b*. The second chip 602*b* contains a reset transistor 604 with source/drain terminals connected to a source/drain terminal of the transfer transistor 109 and to ground 606. The reset transistor 604 is activated by a signal at its gate, and when activated sets the output of the transfer transistor to a ground state, resetting the pixel so that another measurement may be taken. A source-follower transistor 608 is gated by a charge from the source/drain terminal of the transfer transistor 109, and is further coupled to a supply voltage 612 and a read transistor 610. The read transistor 610 controls the output of the source-follower transistor 608, and in some embodiments is coupled to the third chip 602*c* containing an application specific integrated circuit (ASIC) 614.

As shown in the circuit diagram 600*b* of FIG. 6B, in some embodiments, an in-pixel circuit 616 is coupled to the read transistor 610 and the ASIC 614. In some embodiments, the in-pixel circuit 616 is one of a plurality of in-pixel circuits 616 that are arranged within the plurality of pixels 134 (see FIG. 5), respectively.

With reference to FIGS. 7 through 19, cross-sectional views of some embodiments of a method of forming a pixel array including a substrate contact on the backside of the wafer. Although FIGS. 7 through 19 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 7:
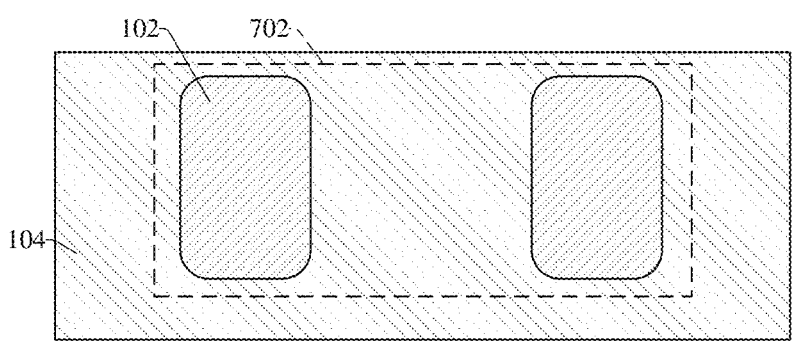
FIGS. 7 through 19 illustrate a series of cross-sectional views of some embodiments of a method of forming a pixel array including a substrate contact on the backside of the wafer.

As shown in the cross-sectional view 700 of FIG. 7, a photodetector 102 is formed in a substrate 104. In some embodiments, the photodetector 102 may, for example, be formed by any of one or more ion implantation processes, one or more diffusion processes, one or more deposition processes, one or more patterning processes, or some other suitable process(es). In some embodiments, the photodetector 102 is strongly doped n-type silicon. In other embodiments, the photodetector 102 is strongly doped p-type silicon. For example, the photodetector 102 may have a carrier concentration between $10^{13}$ and $10^{18}$ cm$^{-3}$. In some embodiments, the photodetector 102 is one of a plurality of photodetectors 702 that are formed concurrently.

Figure 8:
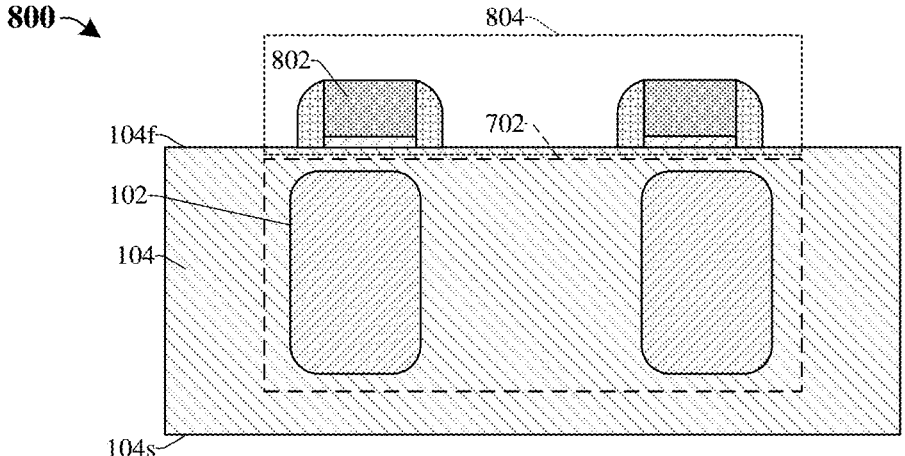

As shown in the cross-sectional view 800 of FIG. 8, a transfer transistor gate stack 802 is formed on a first side 104*f* of the substrate 104. In some embodiments, the transfer transistor gate stack 802 may, for example, be formed by any of one or more one or more deposition processes, one or more patterning processes, or some other suitable process (es). In some embodiments, the transfer transistor gate stack 802 is formed directly over the photodetector 102. In other embodiments, the transfer transistor gate stack 802 is laterally spaced from the photodetector 102 such that the photodetector is to one side of the transfer transistor gate stack 802. In some embodiments, the transfer transistor gate stack 802 is formed from a conductive electrode separated from the substrate 104 by a dielectric. In some embodiments, the conductive electrode comprises one of doped polysilicon, tungsten, aluminum, copper, or another conductive material. In some embodiments, the dielectric comprises one of a high-K dielectric material, silicon dioxide (SiO$_2$), or another suitable material. In some embodiments, the transfer transistor gate stack 802 is one of a plurality of transfer transistor gate stacks 804 that overly the plurality of photodetectors 702.

Figure 9:
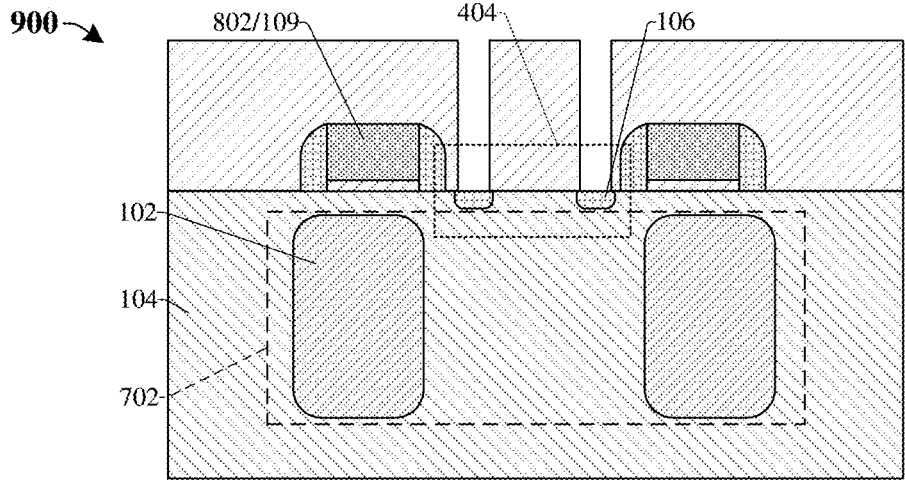

As shown in the cross-sectional view 900 of FIG. 9, a floating diffusion region 106 is formed on the first side 104*f* of the substrate 104. In some embodiments, the floating diffusion region 106 is a doped region and may, for example, be formed by any of one or more ion implantation processes, one or more diffusion processes, one or more deposition processes, one or more patterning processes, or some other suitable process(es). In some embodiments, the floating diffusion region 106 is formed by first forming a first dielectric layer 114 on the first side 104*f* of the substrate 104, then forming a gap in the first dielectric layer 114 over where the floating diffusion region 106 will be formed. The floating diffusion region 106 is then formed using a self-aligned ion implantation process.

In some embodiments, the floating diffusion region 106 acts as a drain for the transfer transistor gate stack 802 and the photodetector 102 acts as a source for the transfer transistor gate stack 802, with the combination of features forming a transfer transistor 109 on the substrate 104. In some embodiments, the first dielectric layer 114 is or comprises an oxide (e.g., silicon dioxide), a low-K dielectric material, an extreme low-K dielectric material, the like or any combination of the foregoing. In some embodiments, the floating diffusion region 106 is strongly doped n-type silicon. In other embodiments, the floating diffusion region 106 is strongly doped p-type silicon. In some embodiments, a plurality of floating diffusion regions 404 is formed. In further embodiments, a number of floating diffusion regions in the plurality of floating diffusion regions 404 is equal to a number of photodetectors in the plurality of photodetectors 702. In other embodiments, the number of floating diffusion regions in the plurality of floating diffusion regions 404 is less than the number of photodetectors in the plurality of photodetectors 702.

Figure 10:
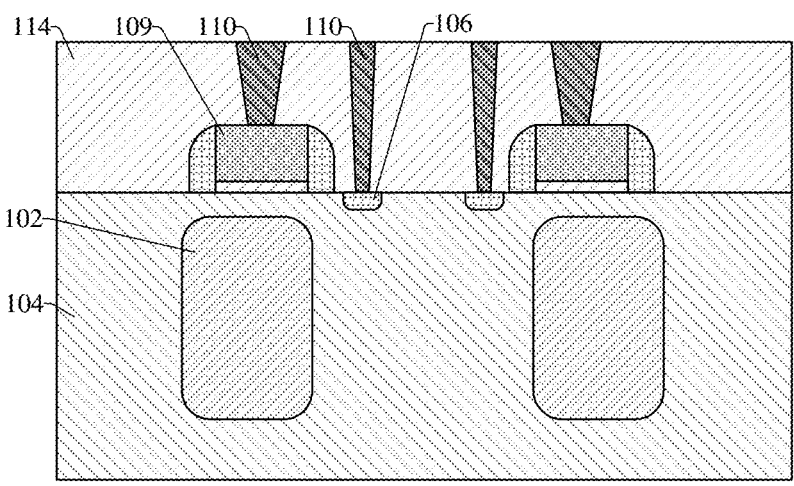

As shown in the cross-sectional view 1000 of FIG. 10, first contacts 110 are formed on the first side 104*f* of the substrate 104. In some embodiments, the first contacts 110 are or comprise a metal, such as copper (Cu), titanium nitrate (TiN), tungsten (W), aluminum (Al), tantalum nitrate (TaN), the like, or any combination of the foregoing. In some embodiments, the first dielectric layer 114 is patterned to form contact openings (not shown) exposing the transfer transistor 109 and the floating diffusion region 106. The first contacts 110 are then formed in the contact openings. In some embodiments, the first contacts 110 are formed by depositing a conductive material within the contact openings and then using a planarization process to remove the conductive material from above the contact openings. The depositing may, for example, be performed by chemical vapor deposition (CVD), physical vapor deposition (PVD), atomic layer deposition (ALD), sputtering, electrochemical plating, electroless plating, some other suitable deposition process, or a combination of the foregoing. The planarization may, for example, be performed by a chemical mechanical planarization (CMP) process or some other suitable process.

Figure 11:
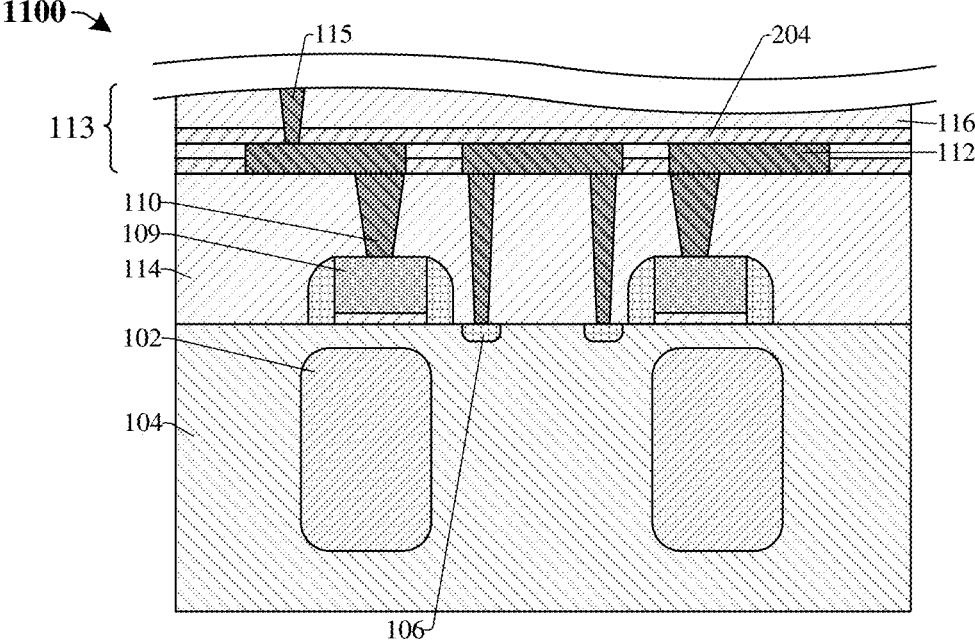

As shown in the cross-sectional view 1100 of FIG. 11, a first interconnect structure 113 is formed over the first dielectric layer 114. The first interconnect structure 113 comprises a plurality of wires 112 and a plurality of vias 115 stacked in alternating layers. The alternating layers are separated by etch stop layers 204 and are surrounded with a first interconnect dielectric 116. In some embodiments, the plurality of wires 112 and the plurality of vias 115 are or comprise a metal, such as copper (Cu), titanium nitrate (TiN), tungsten (W), aluminum (Al), tantalum nitrate (TaN), the like, or any combination of the foregoing. In some embodiments, the first interconnect dielectric 116 is or comprises an oxide (e.g., silicon dioxide), a low-K dielectric material, an extreme low-K dielectric material, the like or any combination of the foregoing. In some embodiments, the etch stop layers 204 are or comprise silicon carbide, silicon nitride, the like, or any combination of the foregoing. In some embodiments, the first interconnect structure 113 may, for example, be formed by any of one or more one or more deposition processes, one or more patterning processes, or some other suitable process(es). The first interconnect structure 113 is electrically coupled to the first contacts 110 and connects the floating diffusion region 106 and the transfer transistor to the pixel circuitry (not shown).

Figure 12:
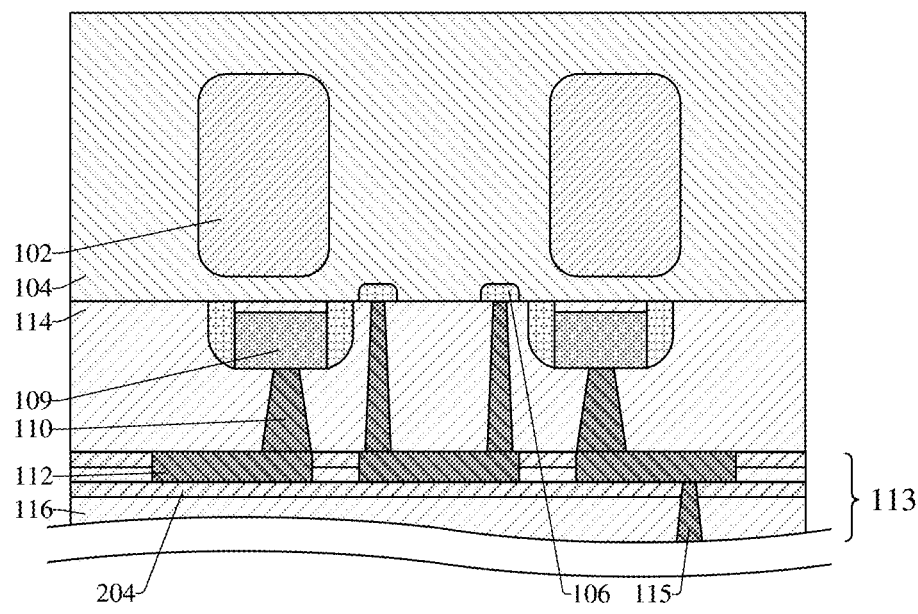

As shown in the cross-sectional view 1200 of FIG. 12, the substrate 104 is rotated such that a second side 104s of the substrate 104 is over the first side 104f of the substrate 104.

Figure 13:
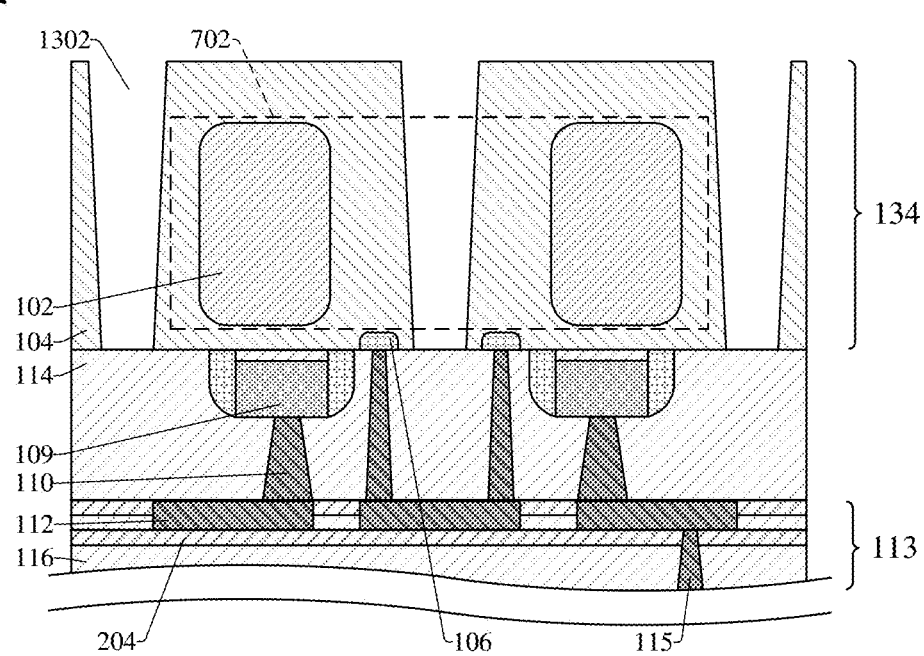

As shown in the cross-sectional view 1300 of FIG. 13, a plurality of trenches 1302 are formed in the second side 104s of the substrate 104. In some embodiments, the plurality of trenches 1302 are formed in a grid pattern and extend to the first side 104f of the substrate 104. In further embodiments, the substrate 104 in the pixel region is divided into a plurality of pixels 134 comprising a first pixel and a second pixel, with the plurality of photodetectors 702 evenly distributed across the plurality of pixels 134. In some embodiments, the plurality of trenches 1302 are formed, for example, by performing a patterning process on the second side 104s of the substrate 104. The patterning process comprises, for example, forming a patterned masking layer (not shown) over the second side 104s with openings in a grid shape surrounding the photodetector 102, and etching the substrate 104, forming trenches following the pattern exposed by the patterned masking layer. In some embodiments, the formation of the plurality of trenches may comprise one or more patterning steps, such that the plurality of trenches extends to the first side of the substrate 104 at some intersections of the grid pattern, but does not extend to the first side of the substrate 104 at other intersections of the grid pattern, leaving room for a floating diffusion region 106 shared between multiple pixels.

Figure 14:
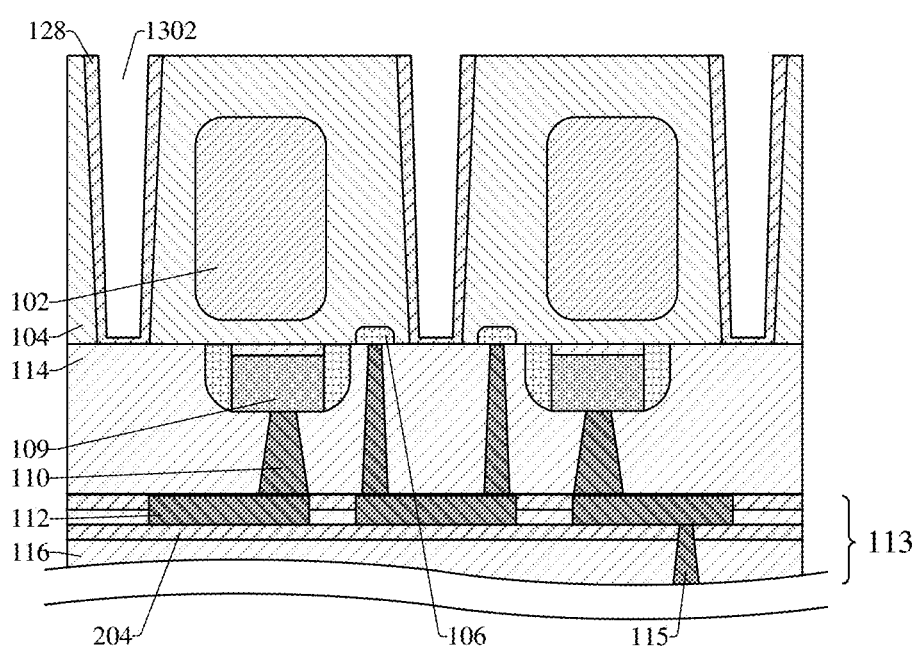

As shown in the cross-sectional view 1400 of FIG. 14, an insulative layer 128 is formed within the plurality of trenches 1302. A process for forming the insulative layer 128, for example, comprises depositing dielectric material filling the plurality of trenches 1302 and planarizing a top surface of the dielectric material, such that a top surface of the insulative layer 128 is level with the second side 104s of the substrate 104. In some embodiments, the trench liner may comprise an oxide (e.g., silicon oxide), a nitride (e.g., silicon nitride), or another dielectric material.

Figure 15:
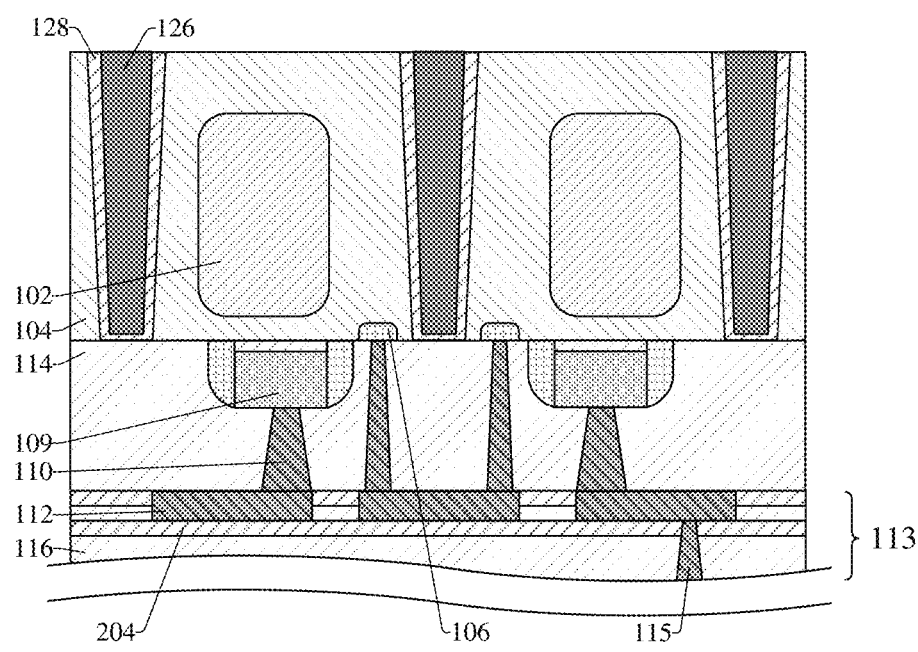

As shown in the cross-sectional view 1500 of FIG. 15, the plurality of trenches 1302 (see FIG. 14) are filled, forming a plurality of DTI segments 136 in a grid pattern. In some embodiments, the plurality of trenches 1302 are filled with a dielectric material such as an oxide (e.g., silicon oxide), a nitride (e.g., silicon nitride), or another dielectric material. In other embodiments, the plurality of trenches are filled with polysilicon. The formation of the plurality of DTI segments 136 further comprises filling the trenches with a material as described above, and performing a planarization process (e.g., a chemical mechanical planarization (CMP) process) to remove the excess material from above the second side 104s of the substrate 104.

Figure 16:
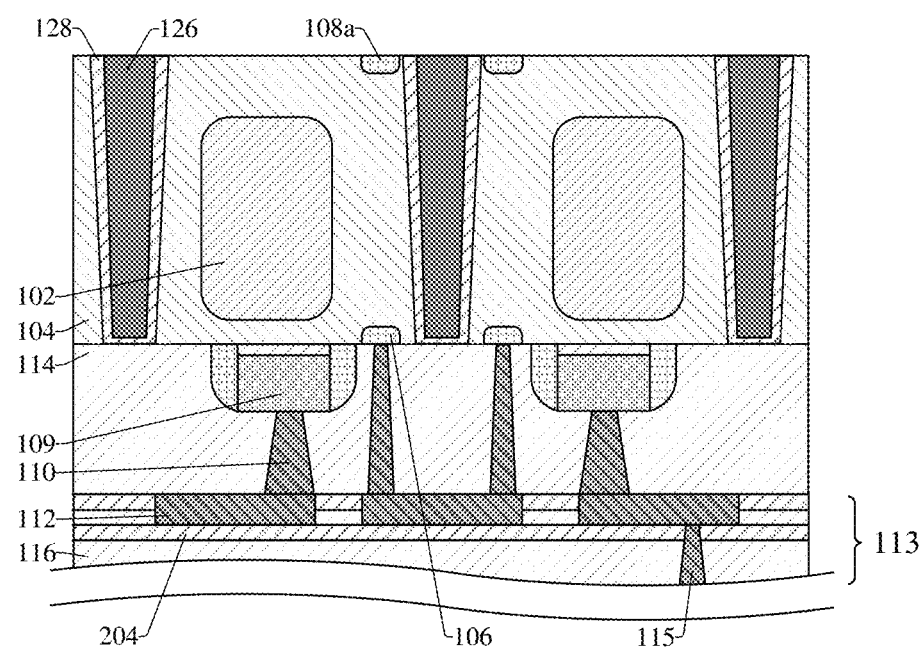

As shown in the cross-sectional view 1600 of FIG. 16, a first body contact region 108a is formed on the second side 104s of the substrate 104. In some embodiments, the first body contact region 108a may, for example, be formed by any of one or more ion implantation processes, one or more diffusion processes, one or more deposition processes, one or more patterning processes, or some other suitable process(es). In some embodiments, the first body contact region 108a extends into the substrate 104 to a first distance 303, wherein the first distance 303 is up to 10% of a first thickness 301 of the substrate 104. In other embodiments, the first distance 303 is up to 5% of the first thickness 301, up to 20% of the first thickness 301, or the like. The first thickness 301 is measured from the first side 104f of the substrate 104 to the second side 104s of the substrate 104. In some embodiments, the first body contact region 108a comprises strongly doped n-type silicon. In other embodiments, the first body contact region 108a comprises strongly doped p-type silicon. In some embodiments, the first body contact region 108a is doped to have a polarity opposite of that of the floating diffusion region 106. For example, if the floating diffusion region 106 comprises strongly doped n-type silicon, the first body contact region 108a may comprise strongly doped p-type silicon. In some embodiments, a plurality of body contact regions 138 is formed. In further embodiments, a number of body contacts in the plurality of body contact regions 138 is equal to a number of photodetectors in the plurality of photodetectors 702.

Figure 17:
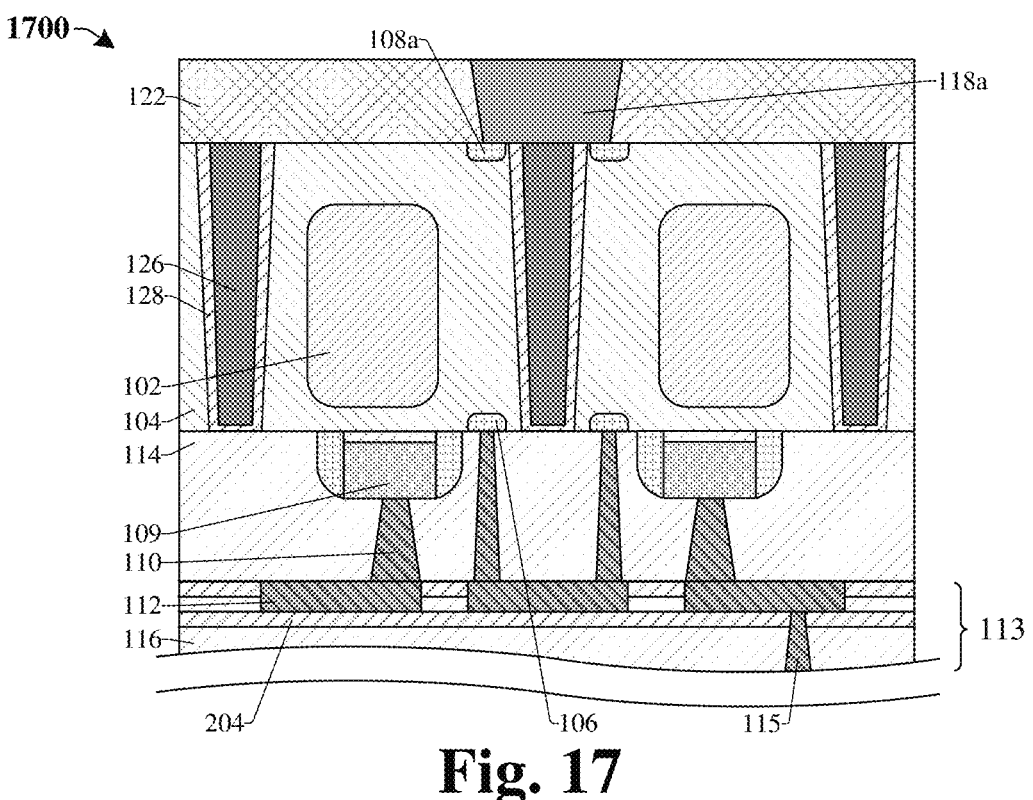

As shown in the cross-sectional view 1700 of FIG. 17, in some embodiments, a conductive structure 118 (see FIG. 1) is formed over the first body contact region 108a. In some embodiments, the conductive structure 118 directly contacts the first body contact region 108a in addition to other body contacts of the plurality of body contact regions 138. In some embodiments, the conductive structure 118 is in the shape of a contact 118a. In other embodiments, the conductive structure 118 is in the shape of a conductive film 118b. In other embodiments, the conductive structure 118 is in the shape of a contact wire 118c. In some embodiments, the conductive structure 118 is formed within a second dielectric layer 122. In some embodiments, the conductive structure 118 is or comprises indium tin oxide (ITO), zinc oxide (ZnO), another transparent conductive material, copper (Cu), silver (Ag), carbon nanotubes, polysilicon, the like, or any combination of the foregoing.

Figure 18:
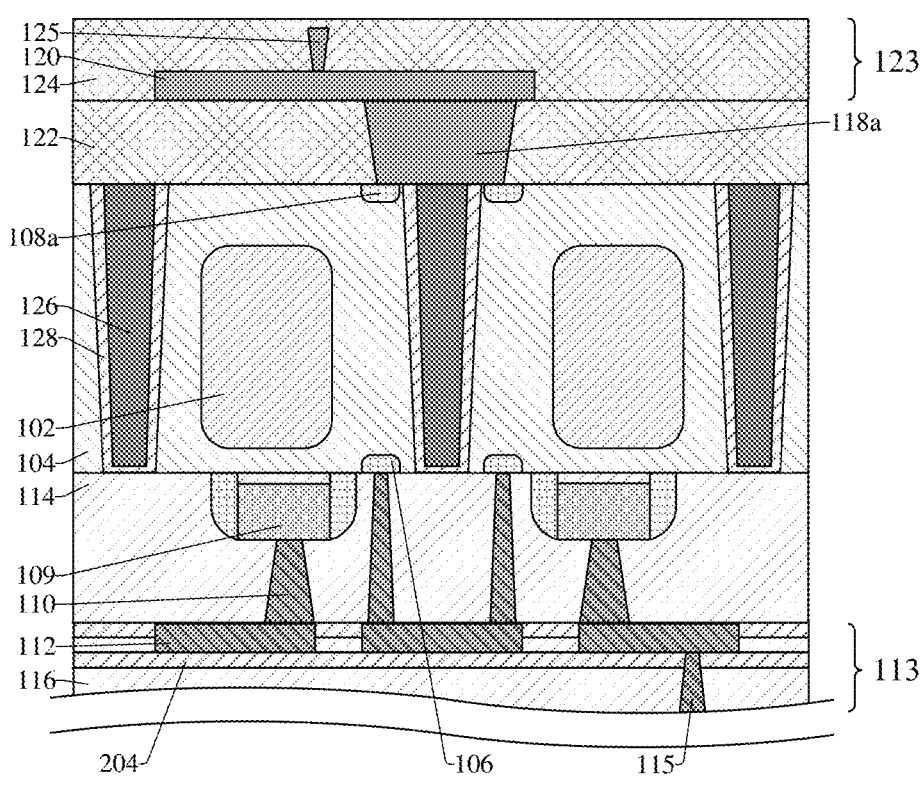

As shown in the cross-sectional view 1800 of FIG. 18, in some embodiments, a second interconnect structure 123 is formed within the second interconnect dielectric 124. The second interconnect structure 123 comprises one or more wire levels with a plurality of wires 120. In some embodiments, the second interconnect structure 123 further comprises one or more via levels with a plurality of vias 125. In some embodiments, the second interconnect structure 123 is coupled to an electrical ground. In other embodiments, the second interconnect structure 123 is coupled to a bias voltage source, which biases the first body contact region 108a and the substrate 104. In some embodiments, such as those where a conductive film 118b is formed over the substrate 104, the second interconnect structure 123 may not be formed. In some embodiments, the second interconnect structure 123 is or comprises indium tin oxide (ITO), zinc oxide (ZnO), another transparent conductive material, copper (Cu), silver (Ag), carbon nanotubes, the like, or any combination of the foregoing. In some embodiments, the second interconnect structure 123 may, for example, be formed by any of one or more one or more deposition processes, one or more patterning processes, or some other suitable process(es).

Figure 19:
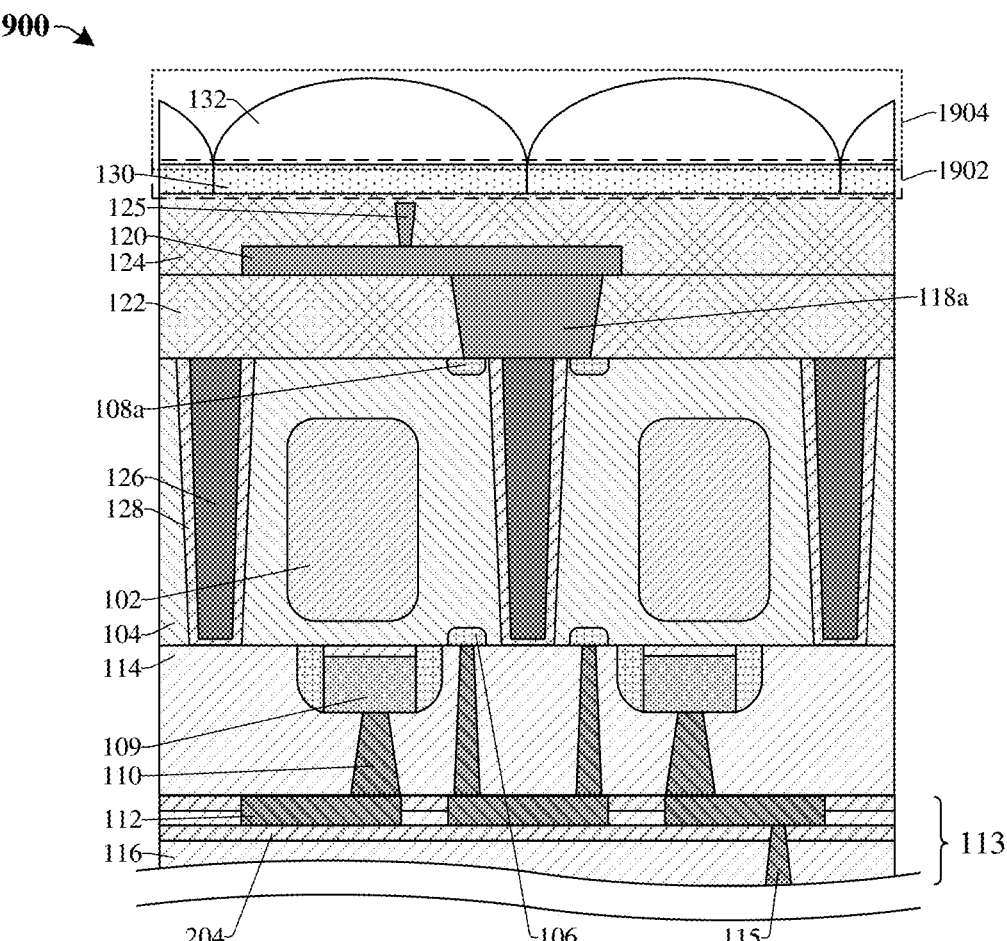

As shown in the cross-sectional view 1900 of FIG. 19, in some embodiments, a color filter 130 and a microlens 132 are formed on the second side 104s of the substrate 104. In some embodiments, a plurality of color filters 1902 and a plurality of microlenses 1904 are formed on the plurality of pixels 134. In some embodiments, the plurality of color filters 1902 comprise one or more different colors formed directly over the plurality of pixels 134. In some embodiments, the color filter 130 may, for example, be formed by any of one or more ion implantation processes, one or more diffusion processes, one or more deposition processes, one or more patterning processes, or some other suitable process (es).

FIG. 20 illustrates a flow diagram 2000 of some embodiments of a method of forming a pixel array including a substrate contact on the backside of the wafer. Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 2002, a first region of a substrate is doped to form a photodetector in a first pixel region. FIG. 7 illustrates a cross-sectional view 700 of some embodiments corresponding to act 2002.

At 2004, a second region on a first side of a substrate is doped to form a floating diffusion region in the first pixel region. FIG. 9 illustrates a cross-sectional view 900 of some embodiments corresponding to act 2004.

At 2006, a first interconnect structure is formed on the first side of the substrate, the first interconnect structure being electrically coupled to the floating diffusion region. FIG. 11 illustrates a cross-sectional view 1100 of some embodiments corresponding to act 2006.

At 2008, a third region on a second side of a substrate opposite the first side is doped to form a first body contact region in the first pixel region. FIG. 16 illustrates a cross-sectional view 1600 of some embodiments corresponding to act 2008.

At 2010, a second interconnect structure is formed on the second side of the substrate, electrically coupled to the first body contact region. FIG. 18 illustrates a cross-sectional view 1800 of some embodiments corresponding to act 2010.

Therefore, the present disclosure relates to a method of forming a pixel array including a substrate contact on the backside of the wafer to increase pixel scalability without increasing the leakage between the floating diffusion region and the body contact region.

Some embodiments relate to an integrated chip including a substrate having a first side and a second side opposite the first side. The integrated chip further includes a first photodetector positioned in a first pixel region within the substrate. A floating diffusion region with a first doping concentration of a first polarity is positioned on the first side of the substrate in the first pixel region. A first body contact region with a second doping concentration of a second polarity different from the first polarity is positioned on the second side of the substrate in the first pixel region.

Other embodiments relate to a pixel array including a substrate having a first side, a second side opposite the first side, and a first thickness measured from the first side to the second side. A deep trench isolation (DTI) structure is positioned within the substrate, the DTI structure including a plurality of DTI segments aligned in a grid pattern and dividing the substrate into a plurality of pixels. A plurality of photodetectors are also positioned within the substrate; the plurality of photodetectors being arranged within the plurality of pixels, respectively, as viewed from a top view. A plurality of floating diffusion regions are on the first side of the substrate, the plurality of floating diffusion regions being arranged within the plurality of pixels, respectively, as viewed in the top view. A plurality of body contact regions are on the second side of the substrate and extending up to a first distance into the substrate, where the first distance is up to 10% of the first thickness as viewed in a cross sectional view. The plurality of body contact regions are arranged within the plurality of pixels, respectively, as viewed in the top view.

Some other embodiments relate to a method of forming an integrated chip including doping a first region of a substrate to form a photodetector in a first pixel region. A second region on a first side of a substrate is doped to form a floating diffusion region in the first pixel region. A first interconnect structure is formed on the first side of the substrate; the first interconnect structure is electrically coupled to the floating diffusion region. A third region on a second side of a substrate opposite the first side is doped to form a first body contact region in the first pixel region. A second interconnect structure is formed on the second side of the substrate, electrically coupled to the first body contact region.

It will be appreciated that in this written description, as well as in the claims below, the terms "first", "second", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first dielectric layer" described in connection with a first figure may not necessarily correspond to a "first dielectric layer" described in connection with another figure, and may not necessarily correspond to a "first dielectric layer" in an un-illustrated embodiment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
   a substrate having a first side and a second side opposite the first side;
   a first photodetector positioned in a first pixel region within the substrate;
   a first doped region with a first doping concentration of a first polarity positioned on the first side of the substrate in the first pixel region;
   a first body contact region with a second doping concentration of a second polarity different from the first polarity positioned on the second side of the substrate in the first pixel region;

a contact on the first body contact region, the contact comprising outer sidewalls extending from the second side of the substrate to a first distance from the substrate;

a first dielectric layer on the second side, having a first surface facing away from the substrate, and having inner sidewalls surrounding the outer sidewalls of the contact; and a first wire coupled to the contact and having a second surface facing the first dielectric layer and the contact, the second surface extending across the first surface of the first dielectric layer.

2. The integrated chip of claim 1, wherein the first wire has a first outer sidewall vertically aligned with the first pixel region and a second outer sidewall laterally spaced from the first pixel region.

3. The integrated chip of claim 1, further comprising a microlens over the first wire, wherein the first wire is between the microlens and the substrate.

4. The integrated chip of claim 1, further comprising:

a second photodetector in a second pixel region within the substrate;

a second body contact region on the second side of the substrate within the second pixel region, the second body contact region having the second doping concentration and the second polarity; and a first deep trench isolation (DTI) segment separating the first pixel region from the second pixel region, wherein the first body contact region extends past outer sidewalls of the first DTI segment in a first direction and wherein the second body contact region extends past outer sidewalls of the first DTI segment in a second direction opposite the first direction.

5. The integrated chip of claim 4, wherein the outer sidewalls of the contact directly overly the first pixel region and at least a portion of the outer sidewalls are laterally spaced from the first DTI segment.

6. The integrated chip of claim 4, wherein the outer sidewalls of the contact directly overly the first pixel region and the second pixel region, and wherein a first portion of the outer sidewalls is laterally spaced from the first DTI segment in the first direction and a second portion of the outer sidewalls is laterally spaced from the first DTI segment in the second direction.

7. The integrated chip of claim 6, further comprising:

a third pixel region in the substrate;

a third body contact region in the third pixel region;

a fourth pixel region in the substrate;

a fourth body contact region in the fourth pixel region; and a second DTI segment extending in the first direction and intersecting the first DTI segment, wherein the second DTI segment has a first plurality of outer sidewalls extending between the first pixel region and the third pixel region and a second plurality of outer sidewalls extending between the second pixel region and the fourth pixel region, and wherein the outer sidewalls of the contact overly the third pixel region and the fourth pixel region, the contact electrically coupled the first, second, third, and fourth body contact regions together.

8. A pixel array, comprising:

a substrate having a first side, a second side opposite the first side, and a first thickness measured from the first side to the second side;

a deep trench isolation (DTI) structure positioned within the substrate, the DTI structure comprising a plurality of DTI segments aligned in a grid pattern dividing the substrate into a plurality of pixel regions;

a plurality of photodetectors positioned within the substrate, the plurality of photodetectors being arranged within the plurality of pixel regions, respectively, when viewed from a top down perspective;

a plurality of floating diffusion regions on the first side of the substrate, the plurality of floating diffusion regions being arranged within the plurality of pixel regions, respectively, when viewed from the top down perspective; and a plurality of body contact regions on the second side of the substrate and extending up to a first distance into the substrate, wherein the first distance is up to 20% of the first thickness when viewed from a cross sectional perspective, wherein the plurality of body contact regions are arranged within the plurality of pixel regions, respectively, when viewed from the top down perspective, wherein the plurality of body contact regions are disposed outside of the plurality of DTI segments when viewed from the top down perspective, and wherein, for individual body contact regions of the plurality of body contact regions in corresponding individual pixel regions of the plurality of pixel regions, the individual body contact regions are closer to first intersections of the DTI segments defining the corresponding individual pixel regions than second intersections of the DTI segments defining the corresponding individual pixel regions when viewed from the top down perspective.

9. The pixel array of claim 8, further comprising:

a first body contact region of the plurality of body contact regions in a first pixel region of the plurality of pixel regions;

a second body contact region of the plurality of body contact regions in a second pixel region of the plurality of pixel regions, the second body contact region separated from the first body contact region by the DTI structure;

a third body contact region of the plurality of body contact regions in a third pixel region of the plurality of pixel regions;

an insulative layer on the second side of the substrate and having a first surface facing away from the substrate;

an interconnect wire on the first surface of the insulative layer and electrically coupling the first body contact region and the third body contact region; and a contact wire contacting the first body contact region and the second body contact region and extending from the first body contact region and the second body contact region to the first surface of the insulative layer.

10. The pixel array of claim 8, wherein a first DTI segment and a second DTI segment of the DTI structure comprise an insulative material and perpendicularly intersect one another at an intersection to define quadrants of the substrate about the intersection corresponding to four pixel regions of the plurality of pixel regions, and wherein a first body contact region, a second body contact region, a third body contact region, and a fourth body contact region of the plurality of body contact regions are respectively in a semiconductor material of the four pixel regions and positioned on the second side of the substrate in the quadrants, respectively; and a conductive structure having a sidewall extending from the semiconductor material of the substrate to a first distance away from the substrate and contacting the first body contact region, the second body contact region, the third body contact region, and the fourth body contact region.

11. The pixel array of claim 10, wherein the conductive structure comprises a contact having a substantially circular cross-section from a top-down perspective and contacting the first body contact region, the second body contact region, the third body contact region, and the fourth body contact region.

12. The pixel array of claim 8, further comprising a contact coupled to the plurality of body contact regions, the contact extending from above the DTI structure to points overlying the plurality of pixel regions and laterally spaced from the DTI structure.

13. The pixel array of claim 8, wherein the plurality of floating diffusion regions have a quantity less than a quantity of the plurality of body contact regions and less than a quantity of the plurality of photodetectors in the pixel array.

14. The pixel array of claim 8, wherein the plurality of body contact regions are respectively disposed in a semiconductor material of corresponding pixel regions, and have centers that are offset from centers of the corresponding pixel regions in a lateral direction when viewed from a top down perspective.

15. A method of forming an integrated chip, comprising:
    doping a first region of a substrate to form a photodetector in a first pixel region;
    doping a second region on a first side of the substrate to form a floating diffusion region in the first pixel region;
    forming a first interconnect structure on the first side of the substrate, the first interconnect structure being electrically coupled to the floating diffusion region;
    forming a deep trench isolation (DTI) structure on a second side of the substrate opposite the first side of the substrate and comprising a plurality of DTI segments surrounding the first pixel region with outer sidewalls comprising a dielectric material and interfacing a semiconductor material of the first pixel region;
    doping a third region on the second side of the substrate after forming the DTI structure to form a first body contact region in the semiconductor material of the first pixel region, wherein the first body contact region is surrounded by the outer sidewalls of the plurality of DTI segments that interface the semiconductor material of the first pixel region; and
    forming a second interconnect structure on the second side of the substrate, electrically coupled to the first body contact region.

16. The method of claim 15, further comprising forming a contact overlying and electrically coupled to the first body contact region after doping the third region, wherein the contact comprises an outer sidewall extending over the second side of the substrate, over the semiconductor material of the first pixel region, and between the outer sidewalls of the DTI structure that interface the semiconductor material of the first pixel region.

17. The method of claim 15, wherein the DTI structure extends from the first side of the substrate to the second side of the substrate, and wherein forming the DTI structure further comprises:
    etching a plurality of trenches into the substrate from the second side, the plurality of trenches extending through the substrate in a grid pattern;
    depositing the dielectric material into the plurality of trenches, the dielectric material interfacing the semiconductor material of the substrate; and
    depositing a fill into the plurality of trenches, filling the plurality of trenches.

18. The method of claim 17, wherein the grid pattern comprises a first intersection;
    wherein forming the second interconnect structure further comprises forming a conductive contact electrically coupling the first body contact region to the second interconnect structure, the conductive contact having a sidewall extending from a point overlying the DTI structure and laterally offset from the first body contact region to a point overlying the first body contact region and laterally offset from the DTI structure; and
    wherein, when viewed from a top down perspective, the conductive contact is centered on the first intersection.

19. The method of claim 15, wherein the DTI structure extends across the substrate in a grid pattern comprising a first intersection of grid segments, wherein a center of the first pixel region is in an opening between the grid segments, and wherein a center of the first body contact region is offset from a center of the first intersection and the center of the first pixel region.

20. The method of claim 15, wherein when viewed from a cross-sectional view, the first body contact region is laterally offset by a first nonzero distance from a center of a first DTI segment having a first sidewall facing the first body contact region, and is offset by a second nonzero distance from a center of a second DTI segment having a second sidewall facing the first body contact region, and wherein both the first sidewall and the second sidewall interface with the semiconductor material in the first pixel region.

* * * * *